US009899377B2

(12) United States Patent
Schulze et al.

(10) Patent No.: US 9,899,377 B2
(45) Date of Patent: Feb. 20, 2018

(54) INSULATED GATE SEMICONDUCTOR DEVICE WITH SOFT SWITCHING BEHAVIOR

(71) Applicant: Infineon Technologies AG, Neubiberg (DE)

(72) Inventors: Hans-Joachim Schulze, Taufkirchen (DE); Franz-Josef Niedernostheide, Hagen am Teutoburger Wald (DE); Frank Dieter Pfirsch, Munich (DE); Francisco Javier Santos Rodriguez, Villach (AT); Stephan Voss, Munich (DE); Wolfgang Wagner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/299,645

(22) Filed: Oct. 21, 2016

(65) Prior Publication Data

US 2017/0125407 A1 May 4, 2017

(30) Foreign Application Priority Data

Oct. 29, 2015 (DE) .................. 10 2015 118 524

(51) Int. Cl.
*H01L 27/088* (2006.01)
*H01L 21/8234* (2006.01)
(Continued)

(52) U.S. Cl.
CPC ...... *H01L 27/088* (2013.01); *H01L 21/82345* (2013.01); *H01L 21/823418* (2013.01); *H01L 21/823475* (2013.01); *H01L 27/082* (2013.01); *H01L 29/0607* (2013.01); *H01L 29/0834* (2013.01); *H01L 29/4238* (2013.01);
(Continued)

(58) Field of Classification Search
CPC ............. H01L 29/1095; H01L 29/4236; H01L 29/42372; H01L 29/42376; H01L 29/4238; H01L 29/7813; H01L 29/0696; H01L 29/4916; H01L 29/7393; H01L 29/7395; H01L 2924/13055; H01L 21/82345; H01L 27/088
See application file for complete search history.

(56) References Cited

U.S. PATENT DOCUMENTS 6,541,827 B1 * 4/2003 Takaishi .............. H01L 29/4238
257/296
7,851,349 B2 12/2010 Rieger et al.
(Continued)

FOREIGN PATENT DOCUMENTS

DE    10 2006 045 126 B4    2/2012
DE    11 2010 003 113 T5    9/2012

*Primary Examiner* — Tucker J Wright
(74) *Attorney, Agent, or Firm* — Volpe and Koenig, P.C.

(57) ABSTRACT

A semiconductor device and a method for producing thereof is provided. The semiconductor device includes a plurality of device cells, each comprising a body region, a source region, and a gate electrode adjacent to the body region and dielectrically insulated from the body region by a gate dielectric; and an electrically conductive gate layer comprising the gate electrodes or electrically connected to the gate electrodes of the plurality of device cells. The gate layer is electrically connected to a gate conductor and includes at least one of an increased resistance region and a decreased resistance region.

14 Claims, 11 Drawing Sheets

(51) Int. Cl.
*H01L 27/082* (2006.01)
*H01L 29/06* (2006.01)
*H01L 29/423* (2006.01)
*H01L 29/49* (2006.01)
*H01L 29/739* (2006.01)
*H01L 29/66* (2006.01)
*H01L 29/749* (2006.01)
*H01L 29/08* (2006.01)
H01L 27/06 (2006.01)

(52) U.S. Cl.
CPC .... *H01L 29/42376* (2013.01); *H01L 29/4916* (2013.01); *H01L 29/4983* (2013.01); *H01L 29/6634* (2013.01); *H01L 29/66348* (2013.01); *H01L 29/66363* (2013.01); *H01L 29/7393* (2013.01); *H01L 29/7397* (2013.01); *H01L 29/749* (2013.01); H01L 27/0629 (2013.01); H01L 29/0696 (2013.01); H01L 29/7396 (2013.01)

(56) References Cited

U.S. PATENT DOCUMENTS

2006/0273390 A1* 12/2006 Hshieh .................. H01L 24/26
        257/331
2011/0024834 A1  2/2011 Hull et al.
2011/0294289 A1  12/2011 Reiger et al.
2015/0014743 A1  1/2015 Werber et al.

* cited by examiner

INSULATED GATE SEMICONDUCTOR DEVICE WITH SOFT SWITCHING BEHAVIOR

FIELD

This disclosure in general relates to an insulated gate semiconductor device.

BACKGROUND

Insulated gate semiconductor devices such as, for example, Insulated Gate Bipolar Transistors (IGBTs) or Metal Oxide Semiconductor Field-Effect Transistors (MOSFETs) are widely used as electronic switches in various types of electronic circuits in automotive, industrial, consumer electronics, or household applications, to name only a few. An IGBT is a bipolar semiconductor device that includes a first emitter region (also referred to as source region) of a first conductivity type (doping type), a second emitter region (also referred to as drain region) of a second conductivity type, a base region (often referred to as drift region) of the first conductivity type, a body region of the second conductivity type between the first emitter and the base region, and a gate electrode adjacent the body region and dielectrically insulated from the body region by a gate dielectric.

An IGBT can be operated in two different operation states, namely a conducting state (on-state), and a blocking state (off-state). In the conducting state, the first emitter region injects charge carriers of the first conductivity type through a conducting channel in the body region into the base region, and the second emitter region injects charge carriers of the second conductivity type into the base region. These charge carriers injected into the base region by the first and second emitters form a charge carrier plasma in the base region. In the blocking state the conducting channel in the body region is interrupted.

When the IGBT turns off, that is, switches from the conducting state to the blocking state a depletion region expands into the base region beginning at a pn junction between the body region and the base region. Through this, charge carriers forming the charge carrier plasma are removed from the base region. During turn-off there is a current flowing between the first and second emitter region resulting from the removal (extraction) of charge carriers from the base region. This current, which may be referred to as charge carrier extraction current, finally drops to zero as the charge carriers have been removed or recombined. A slope of this current as it tends to zero defines the softness of the component. The steeper the slope, the less "soft" is the turn-off behavior (switching behavior) of the semiconductor device. However, a soft switching behavior is desirable, because steep slopes may cause voltage overshoots in (parasitic) inductances connected to the semiconductor device and/or may cause oscillations or ringing in a circuit in which the semiconductor device is employed.

There is therefore a need to provide an insulated gate semiconductor device such as an IGBT with a soft switching behavior.

SUMMARY

One example relates to a semiconductor device. The semiconductor device includes a plurality of device cells, each including a body region, a source region, and a gate electrode adjacent the body region and dielectrically insulated from the body region by a gate dielectric. An electrically conductive gate layer includes the gate electrodes or is electrically connected to the gate electrodes of the plurality of device cells. The gate layer is electrically connected to a gate conductor and includes at least one of an increased resistance region and a decreased resistance region.

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
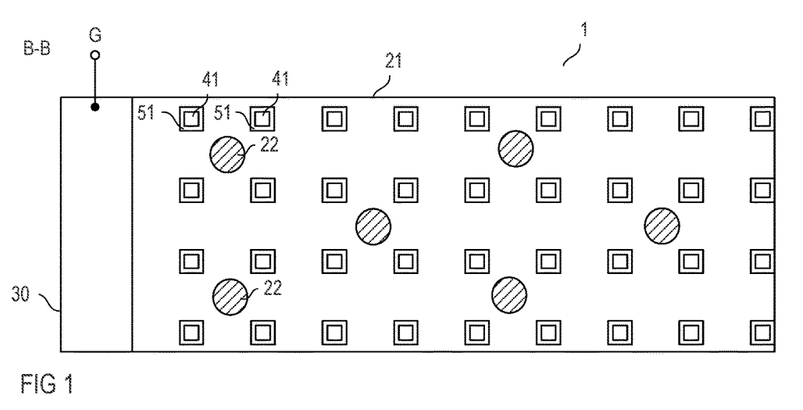
FIG. 1 shows a top view of a section of a gate layer of an insulated gate semiconductor device.

FIG. 1 shows a top view of one section of a gate layer 21 of an insulated gate semiconductor device 1. For example, insulated gate semiconductor device 1 is an Insulated Gate Bipolar Transistor (IGBT) or a Metal Oxide Semiconductor Field-Effect Transistor (MOSFET). The gate layer 21 is electrically connected to a gate conductor 30, which forms or is connected to a gate node G of the semiconductor device. The gate conductor 30 may include at least one of a gate pad and a gate conductor. For example, a gate pad serves to have a bond wire connected thereto, and a gate runner serves to connect the gate layer 21 to the gate pad. Through the bond wire the gate layer may be connected to a leadframe or the like.

Figure 2:
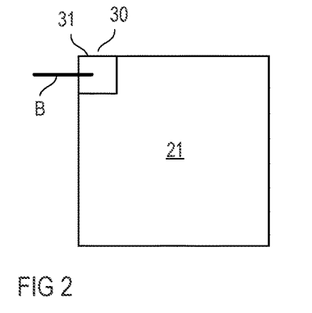
FIG. 2 shows a top view of the overall gate layer according to one example.
Figure 3:
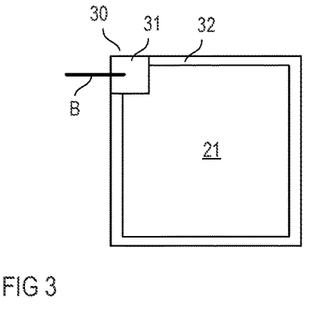
FIG. 3 shows a top view of the overall gate layer according to another example.

FIG. 2 shows a top view of the overall gate layer 21. In this example, the gate conductor 30 includes a gate pad 31, to which a bond wire B may be connected. FIG. 3 shows an example where the gate layer 21 is connected to a gate runner 32, with the gate runner 32 being connected to a gate pad 31. The gate runner 32 may surround the gate layer 21, as shown in FIG. 3, and serves to connect those regions of the gate layer 21 that are spaced apart from the gate pad 31 to the gate pad 31. However, this is only an example. Other configurations may be used as well. The gate pad and the gate runner 32 may have a higher conductivity than the gate layer 21.

Figure 5:
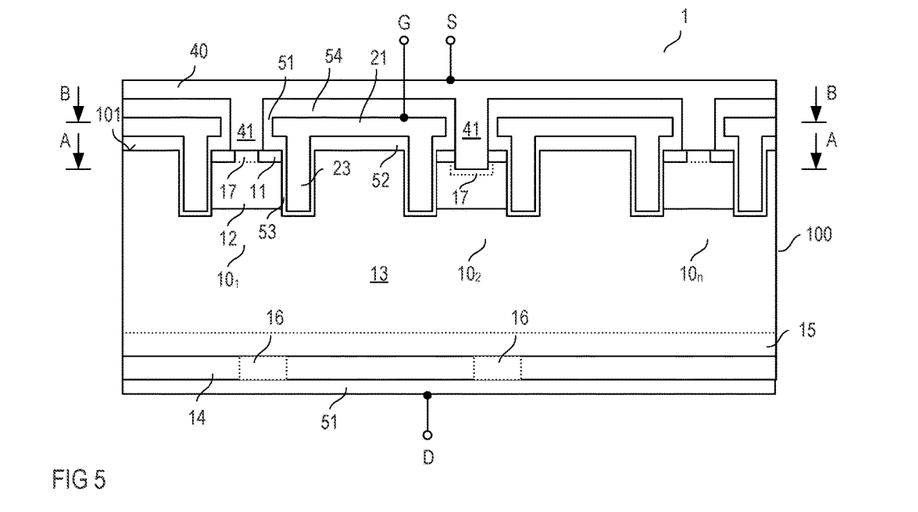
FIG. 5 shows a vertical cross sectional view of an insulated gate semiconductor device according to one example.

The semiconductor device 1 includes a plurality of device cells with each of these device cells including active regions integrated in a semiconductor body below the gate layer 21. This semiconductor body and, therefore, the device cells are out of view in FIG. 1. The active regions of one device cell include a source region. The source region of each device cell is electrically connected to a source via 41 that is electrically insulated from the gate layer 21 by an insulation layer 51. Horizontal cross sectional views of these source vias 41 and the insulation layers 51 are schematically shown in FIG. 5.

The gate layer 21 is electrically conducting. The gate layer 21 may include at least one of a metal and a doped polycrystalline semiconductor material, such as polysilicon. For example, the metal includes aluminum, or copper. According to one example, the gate layer 21 includes only one material. According to another example, the gate layer 21 includes two or more different materials. According to one example, the gate layer 21 includes a layer stack with at least two different electrically conducting layers. Each of these layers is electrically connected to the gate conductor 30.

A specific resistance of the gate layer 21 is dependent on the type of material used to implement the gate layer 21 and, in case of a doped polycrystalline material, the doping concentration. According to one example, shown in FIG. 1, the gate layer 21 includes at least one increased resistance region 22. This increased resistance region 22 includes a material with a higher specific resistance than the specific resistance of a base material of the gate layer 21. The "base material" is the material adjoining the increased resistance region 22. Referring to FIG. 1, the gate layer 21 may include a plurality of increased resistance regions 22 that are spaced apart from each other.

Figure 4:
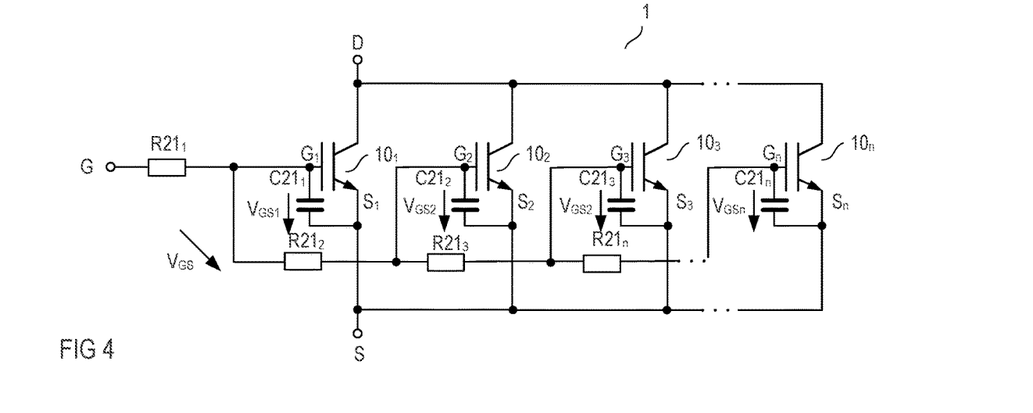
FIG. 4 shows an equivalent circuit diagram of an IGBT including a plurality of device cells.

FIG. 4 shows an equivalent circuit diagram of a semiconductor device that includes a gate layer 21 and a plurality of device cells. Just for the purpose of illustration it is assumed that the semiconductor device 1 is an IGBT. In FIG. 4, a plurality of IGBT circuit symbols $10_1$-$10_n$ are shown. Each of these circuit symbols represents one device cell or a group of device cells of the semiconductor device. Each of the device cells $10_1$-$10_n$ includes a gate electrode. These gate electrodes are not shown in detail in FIG. 4 but are represented by gate nodes $G_1$-$G_n$ of the circuit symbols in FIG. 4. The gate electrodes are electrically connected to a gate node G of the semiconductor device through resistors $R21_1$-$R21_n$. The gate node G shown in FIG. 4 represents the gate conductor 30 explained before. For the purpose of explanation it is assumed that the device cells $10_1$-$10_n$ as represented by the circuit symbols in FIG. 4 are spaced apart differently from the gate conductor. In this example, a distance between a transistor cell and the gate conductor is the larger the farther to the right the circuit symbol is arranged in FIG. 4. For example, a gate resistance of a first transistor cell $10_1$ is $R21_1$, which results from a distance between the transistor cell $10_1$ and the gate conductor, a gate resistance of a second transistor cell $10_2$ essentially equals the gate resistance of the first transistor cell $10_1$ plus an additional resistance resulting from a distance between the first transistor cell $10_1$ and the second transistor cell $10_2$, and so on.

Furthermore, each device cell $10_1$-$10_n$ includes an inherent gate-source capacitance $C21_1$-$C21_n$ between the gate electrode and the source region of the respective device cell. The source regions are not shown in FIG. 4 but are represented by source nodes $S_1$-$S_n$ of the circuit symbols representing the individual device cells. The source nodes of the device cells are connected to a source node S of the semiconductor device.

One way of operation of the semiconductor device 1 is explained in the following with reference to the equivalent circuit diagram shown in FIG. 4. The semiconductor device is a voltage controlled device. Each of individual device cells $10_1$-$10_n$ switches on or off dependent on a voltage between the gate node $G_i$ (where $G_i$ denotes one of the gate nodes $G_1$-$G_n$) and the corresponding source node $S_i$ (where $S_i$ denotes one of the source nodes $G_1$-$G_n$). This voltage is referred to as internal gate-source voltage in the following. For example, one device cell $10_i$ (where $10_i$ denotes one of the device cells $10_1$-$10_n$) switches on when a voltage level of the internal gate-source voltages $V_{CSi}$ rises above a predefined threshold, and switches off when the voltage level of the internal gate-source voltage $V_{CSi}$ falls below a predefined threshold. In the on-state a device cell $10_i$ is capable of conducting a current between the source node $S_i$ and a drain node $D_i$ (where $D_i$ denotes one of the device cells' drain nodes $D_1$-$D_n$ shown in FIG. 4), and in the off-state the device cell blocks. The internal gate-source voltages $V_{GSi1}$. $V_{GSn}$ of the individual device cells $10_1$-$10_n$ are defined by an external gate-source voltage $V_{GSi}$ which is a voltage between the gate node G and the source node S of the semiconductor device. One device cells $10_i$ switches on after the respective internal gate source voltage $V_{GSi}$ has reached the threshold voltage and switches off after the internal gate source voltage $V_{GSi}$ has fallen below the threshold voltage. Due to the gate resistances $R21_1$-$R21_n$ and the gate-source capacitances $C21_1$-$C21_n$ there is a time delay between the time when a voltage level of the external gate-source voltage $V_{GS}$ crosses the threshold voltage and the time when the internal gate source voltages $V_{GS1}$-$V_{GSi}$ of the individual device cells $10_1$-$10_n$ cross the threshold and, therefore, switch on or off. This time delay is referred to as switching delay in the following. If the gate-source capacitances $C21_1$-$C21_n$ are substantially equal then the higher the gate resistance $R21_1$-$R21_n$, the longer is the switching delay.

The gate resistances $R21_1$-$R21_n$ between the gate electrodes (represented by the gate nodes $G_1$-$G_n$ in FIG. 4) and the gate node G of the semiconductor device 1 are formed by the gate layer 21. In a conventional device, in which there are no increased resistance regions in the gate layer, the more distant the respective device cell is spaced apart from the gate conductor, the higher is the gate resistance of the device cell. However, the specific resistance of a gate layer in a conventional semiconductor device is rather low so that there is no significant difference in the switching delays of the individual device cells. In the semiconductor device 1 shown in FIG. 1, however, the gate resistances of the individual device cells can be adjusted, in particular increased, by providing the increased resistance regions 22. Thus, in the type of semiconductor device shown in FIG. 1, a timing (an order) of switching on and off of the individual device cells $10_1$-$10_n$ can be adjusted by providing the increased resistance regions 22. A benefit of this is explained herein further below.

FIG. 5 shows a vertical cross sectional view of an insulated gate semiconductor device 1 according to one example. In particular, FIG. 5 shows a vertical cross sectional view of the semiconductor body 100 in a region where three device cells $10_1$, $10_2$, $10_n$ are located. The semiconductor device 1 shown in FIG. 5 is an IGBT or a MOSFET. Therefore, the device cells of this semiconductor device 1 can also be referred to as transistor cells.

Referring to FIG. 5, each device cell $10_1$-$10_n$ includes active regions. These active regions include a source region 11, and a body region 12 adjoining the source region 11. A gate electrode 23 is adjacent the body region 12 and dielectrically insulated from the body region 12 by a gate dielectric 53. The semiconductor device 1 further includes a drift region 13 adjoining the body region 12 of the individual device cells $10_1$, $10_2$, $10_n$, and a drain region 14 adjoining the drift region 13. The source region 11 and the body region 12 of each device cell are electrically connected to a source via 41. For this, the source via 41 may contact the source region 11 and the body region 12 at a first surface 101 of the semiconductor body 100, as shown in device cell $10_1$ in FIG. 5. According to another example, shown in device cell $10_2$, the source via 41 extends into the body region 12. Optionally, the body region 12 includes a contact region 17 of the same doping type, but more highly doped than the body region 12 and contacted by the source via 41. The source vias 41 are electrically connected to, or form a part of, a source electrode 40. The source electrode 40 is electrically connected to, or forms, a source node S of the semiconductor device 1. The source node S is only schematically illustrated in FIG. 5. The source electrode 40 can be arranged above the gate layer 21 and is dielectrically insulated from the gate layer 21 by a further dielectric layer or insulation layer 54.

In the example shown in FIG. 5, the gate electrodes 23 of the individual device cells $10_1$-$10_n$ are trench electrodes. That is, the gate electrodes 23 are arranged in trenches of the semiconductor body 100. The gate layer 21 is arranged above the first surface 101 of the semiconductor body 100 and is dielectrically insulated from the first surface 101 by a further dielectric layer or insulation layer 52. The gate layer 21 is electrically connected to the gate electrodes 23 of the individual device cells $10_1$-$10_n$.

The semiconductor body 100 may include a conventional semiconductor material, such as, for example, silicon (Si), silicon carbide (SiC), gallium arsenide (GaAs), gallium nitride (GaN), or the like. The source region 11 is a doped semiconductor region of a first doping type (conductivity type), the body region 12 is a doped region of a second doping type (conductivity type) complementary to the first doping type, and the drift region 11 is of the first doping type. The transistor device can be an n-type transistor device or a p-type transistor device. In an n-type transistor device, the source region 11 and the drift region 13 are n-doped and the body region 12 is p-doped. In a p-type transistor device, the source region 11 and the drift region 13 are p-doped, and the body region 12 is n-doped. Furthermore, the transistor device 1 can be implemented as a MOSFET or as an IGBT. In a MOSFET, the drain region 14 has the same doping type as the source region 11 and the drift region 13. In an IGBT, the drain region 14 (which may also be referred to as emitter or collector region) has a doping type complementary to the doping type of the source region 11. Optionally, in a MOSFET, as well in an IGBT, a field-stop region 15 of the same doping type as the drift region 13, but more highly doped than the drift region 13, can be arranged between the drift region 13 and the drain region 14. An IGBT can be implemented as a reverse-conducting (RC) IGBT. In this case, the semiconductor device includes one or more regions of the first doping type (the same doping type as the drift region 13) extending from a drain electrode 51 through the drain region 14 to the drift region 13 or the field-stop region 15, respectively. Those regions 16 are usually referred to as emitter shorts. The drain electrode 51 is electrically connected to the drain region 14 and the optional emitter shorts 16 and is connected to or forms a drain node of the semiconductor device 1. Such drain node D is only schematically illustrated in FIG. 5. For example, the semiconductor body 100 is made of silicon, and a doping concentrations of the individual active device regions are selected from the following doping ranges:

drift region 13: $1E12\ cm^{-3}$-$1E16\ cm^{-3}$;
field-stop region 15: $1E14\ cm^{-3}$-$1E17\ cm^{-3}$;
drain region 14 and emitter shorts 16: $1E16\ cm^{-3}$-$1E21\ cm^{-3}$;
body region 12: $1E15\ cm^{-3}$-$5E17\ cm^{-3}$; and
source region 11 and contact region 17: $1E18\ cm^{-3}$-$1E21\ cm^{-3}$.

Figure 6:
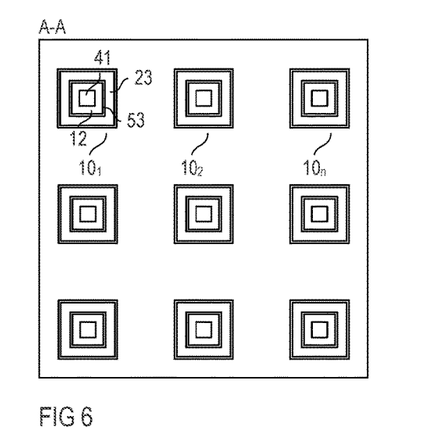
FIG. 6 shows a horizontal cross sectional view of an insulated gate semiconductor device according to one example.
Figure 7:
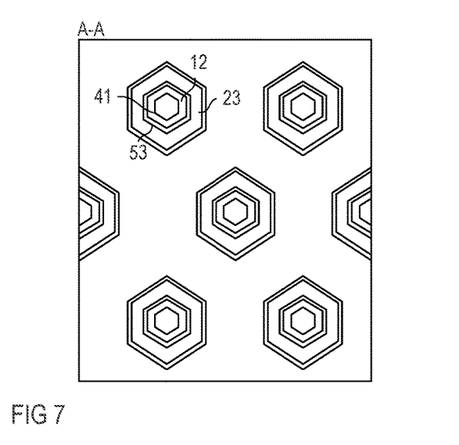
FIG. 7 shows a horizontal cross sectional view of an insulated gate semiconductor device according to another example.

In a horizontal plane of the semiconductor device 1, such as the plane A-A shown in FIG. 5, the individual device cells $10_1$-$10_n$ can have one of several different shapes. The shape of the device cell is substantially defined by the shape of the gate electrode 23 and the body region 12. FIGS. 6 and 7 show horizontal cross sectional views of the semiconductor device 1 in the section plane A-A according to two different examples. In the example shown in FIG. 6, the individual device cells $10_1$-$10_n$ essentially have a rectangular shape; that is, the body region 12 is substantially rectangular and surrounded by the gate electrode 23. In the example shown in FIG. 7, the individual device cells are substantially hexagonal; that is, the body region 12 has a hexagonal shape and is surrounded by the gate electrode 23. Implementing the device cells with a rectangular or hexagonal shape are only two of several different examples. It is even possible, to implement device cells with different shapes in one semiconductor body 100.

Figure 8:
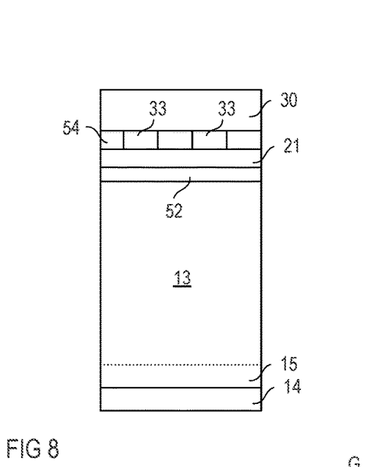
FIG. 8 shows a vertical cross sectional view of an insulated gate semiconductor device in the region of a gate conductor.

According to one example, shown in FIG. 8, the device cells are omitted in the semiconductor body 100 below the gate conductor 30. FIG. 8 shows a vertical cross sectional view of the semiconductor body 100 in the region of the gate conductor 30. In this example, the gate conductor 30 is arranged above the gate layer 21 and is electrically connected to the gate layer 21 by electrically conducting vias 33. For example, the gate layer 21 and the gate electrode 23 include a doped polycrystalline semiconductor material, such as polysilicon. For example, the gate conductor 30 includes a metal, such as copper or aluminium.

Figure 9:
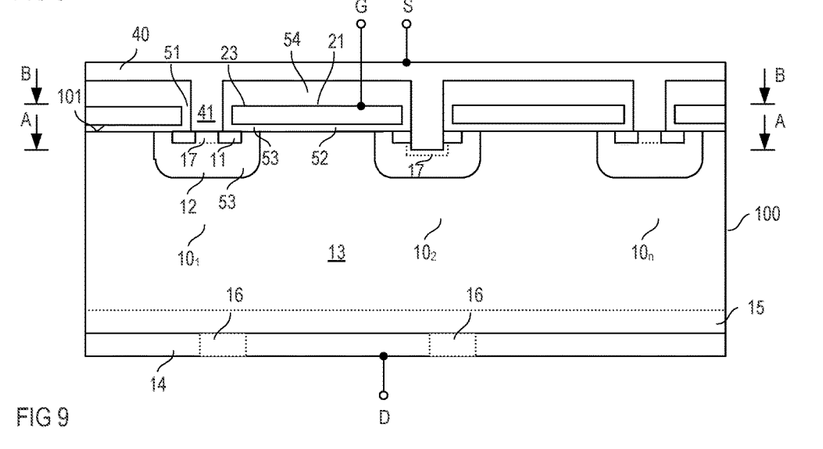
FIG. 9 shows a vertical cross sectional view of an insulated gate semiconductor device according to another example.

According to another example, shown in FIG. 9, the gate electrodes 23 are part of the gate layer 21. In this example, the gate electrodes 23 are located above the first surface 101 of the semiconductor body 100. The same dielectric layer may form the gate dielectric 53 that dielectrically insulates the gate electrodes 23 from the body region 12 and the source region 11, and the dielectric layer 52 that dielectrically insulates the gate layer 21 from those regions of the drift region 13 extending to the first surface 101.

The functionality of the increased resistance regions 22 in an IGBT are explained in the following with reference to the cross sectional views shown in FIGS. 5 and 9. An IGBT can be operated in an on-state and an off-state. In the on-state, the gate-source voltage (the voltage between the gate node G and the source node S) is such that it causes conducting channels in the body regions 12 of the individual device cells $10_1$-$10_n$ along the gate dielectric 53 between the source region 11 and the drift region 13. In the on-state, when a voltage is applied between the drain node D and the source node S, the source regions 11, through the conducting channel in the body region 12, inject charge carriers of a first conductivity type (electrons or holes) into the drift region 13 and the drain region 14 injects charge carriers of an opposite conductivity type into the drift region 13. These charge carriers injected by the source regions 11 and the drain region 14 form a charge carrier plasma in the drift region 13 which, in the on-state, ensures a low on-resistance of the IGBT. The IGBT switches off, when a voltage level of the gate-source voltage is such that the conducting channel in the body region 12 is interrupted. In this case, a depletion region (space charge region) expands into the drift region 13 beginning at pn-junctions between the body regions 12 and the drift region 13 and the charge carrier plasma is removed from the drift region 13. This removal of charge carriers from the drift region 13 provides a current contributing to the current flowing between the source node S and the drain node D. This current, which may be referred to as charge carrier extraction current, finally drops to zero as the charge carriers have been removed from the drift region 13. A slope of this current as it tends to zero defines the softness of the component. The higher the slope, the less "soft" is the switching behaviour of the semiconductor device 1. The increased resistance regions 22 make it possible to adjust the switching delays of the device cells, so that the individual device cells do not switch off at the same time and there are at least some device cells that switch off later than others. Through these device cells that switch off later a current may still flow while the current through other device cells has already decreased to zero. By this, a softer switching behaviour of the IGBT can be obtained. It should be noted that the increased resistance regions 22 do not only increase the softness of an IGBT but can also be used to increase the softness in a MOSFET.

Figure 10:
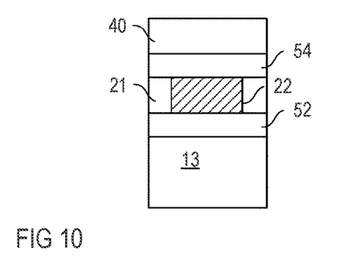
FIG. 10 shows a vertical cross sectional view of an increased resistance region of the gate layer according to one example.
Figure 11:
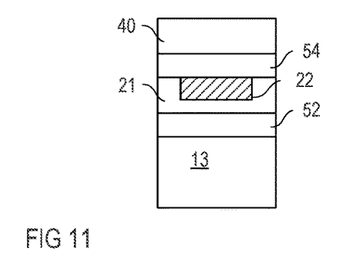
FIG. 11 shows a vertical cross sectional view of an increased resistance region of the gate layer according to another example.

FIG. 10 shows a vertical cross sectional view of one increased resistance region 22 according to one example. In this example, the increased resistance region 22 includes a recess filled with a material different from the material of the gate layer 21 and having a higher specific resistance than the material of the gate layer 21. According to one example, the recess is filled with an electrically insulating material, for example, an oxide. In the example shown in FIG. 10, the recess completely extends through the gate layer 21. According to another example, shown in FIG. 11, the recess extends into the gate layer 21, but not completely through the gate layer 21.

Referring to the above, by adding the at least one increased resistance region 22 one or more device cells can have a higher gate resistance than other device cells. The position of the device cells that have the higher gate resistance and the increase in the gate resistance obtained by adding the increased resistance region 22 is dependent on several parameters, such as, for example, the number of the increased resistance regions 22 and their position in the gate layer 21. Several examples are explained with reference to FIGS. 12-17 below. Each of these figures shows a horizontal cross sectional view of a section of the gate layer 21 according to one example.

Figure 12:
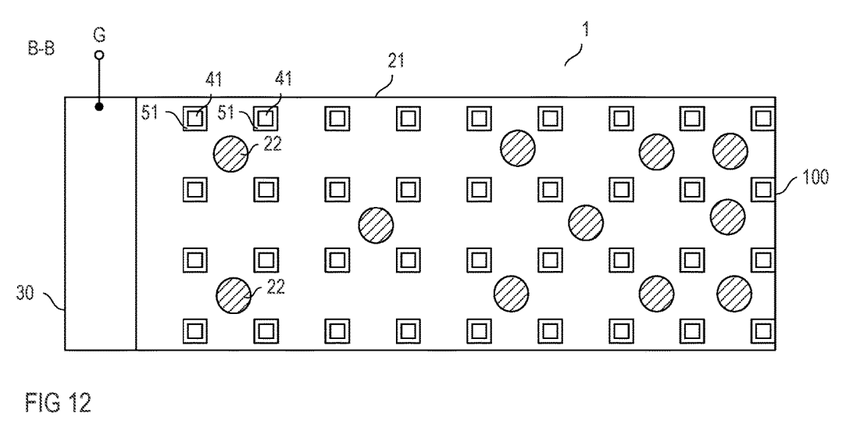
FIGS. 12-18 show top views of sections of the gate layer according to different examples.

FIG. 12 shows an example in which the gate layer 21 includes a plurality of increased resistance regions 22. According to one example, the individual increased resistance regions 22 are substantially identical. That is, the increased resistance regions 22 have the same shape in the horizontal plane, the same depths in the gate layer 21 and include the same type of material. Just for the purpose of explanation it is assumed that the individual increased resistance regions 22 are substantially circular in the horizontal plane. However, this is only an example; other shapes, such as rectangular shapes, polygonal shapes, or the like, can be used as well. In the example shown in FIG. 12, a density (concentration) of the increased resistance regions 22 in the gate layer 21 increases in the gate layer 21 as a distance to the gate conductor 30 increases. That is, if one compares two regions of the same size of the gate layer 21 from which one is more distant to the gate conductor 30 than the other, then in the region more distant to the gate conductor 30 there are more increased resistance regions than in the region closer to the gate conductor 30.

Figure 13:
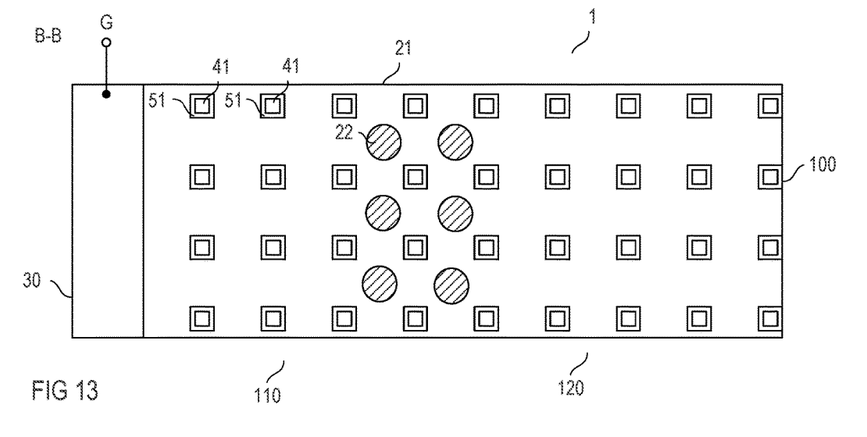

In the example shown in FIG. 13, there is a plurality of increased resistance regions 22 arranged between a first region 110 and a second region 120 of the cell area. The "cell area" is the region of the semiconductor body 100 in which the device cells are integrated. From these regions 110, 120, a first region 110 is closer to the gate conductor 30 than the second region 120. By providing the increased resistance regions 22 between the first region 110 and the second region 120, the device cells located in the second region 120 have a higher gate resistance than the device cells arranged in the first device region 110.

Figure 14:
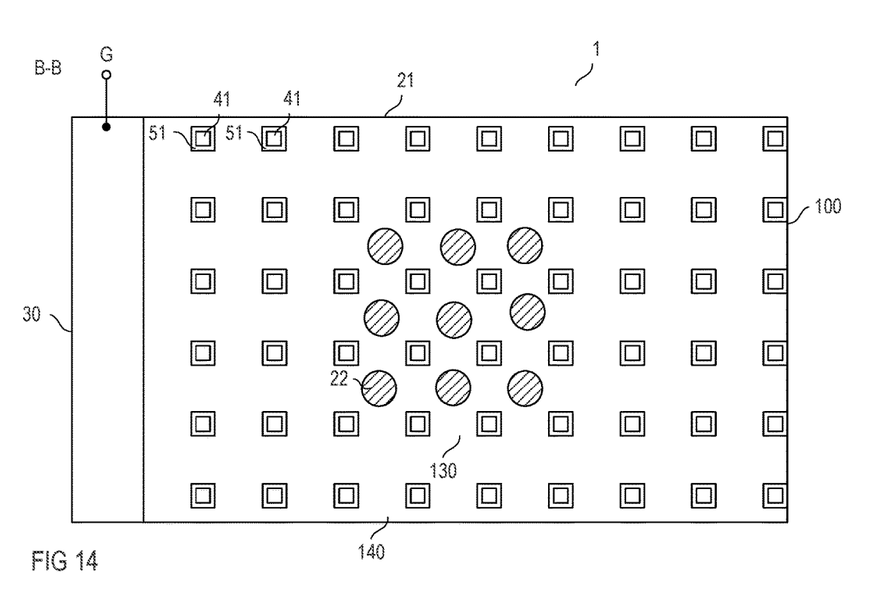

In the example shown in FIG. 14, there is a region 130 of the gate layer 21 which includes a plurality of increased resistance regions 22, while a region 140 surrounding the region 130 includes no increased resistance regions 22. In this example, substantially the device cells below the region 120 with the increased resistance regions 22 have a higher gate resistance than those device cells in the surrounding region 140.

Figure 15:
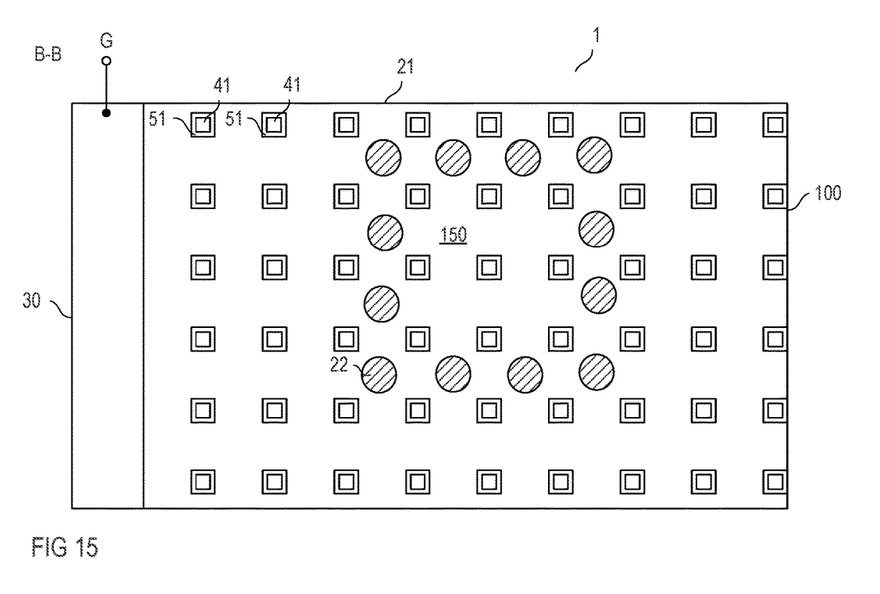

In the example shown in FIG. 15, a plurality of increased resistance regions 22 are arranged such that they are located on a ring that surrounds a region 150 of the gate layer 21. The region 150 of the gate layer surrounded by the ring as defined by the spaced apart high resistance regions 150 includes a plurality of source vias 41. The device cells located below the region 150, that is, the device cells having their respective source via in region 150 have a higher gate resistance than device cells located below regions outside the ring-like structure defined by the increased resistance regions 22. In this example, the ring defined by the increased resistance regions 22 is substantially rectangular. However, this is only an example. Other types of rings, such as circular rings, electrical rings, or the like may be used as well.

Figure 16:
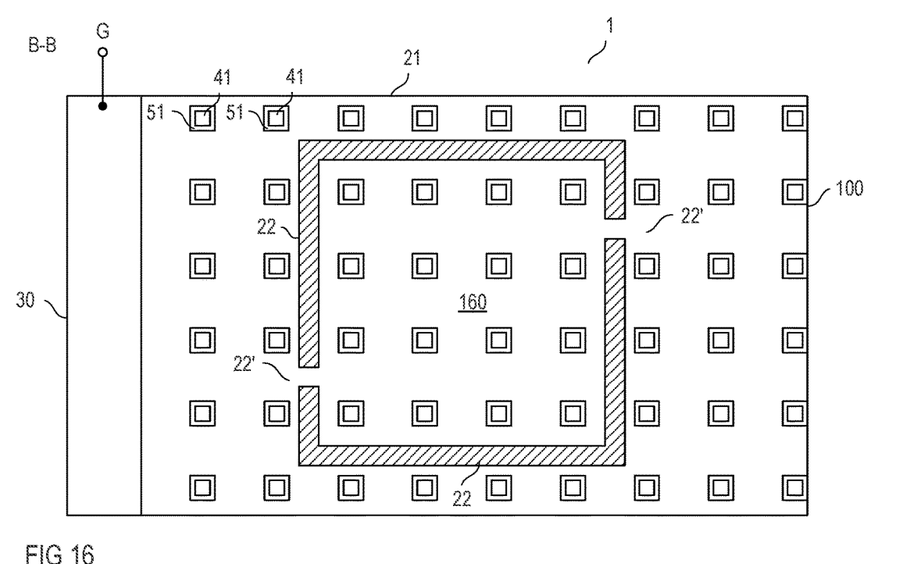

In the example shown in FIG. 16, the gate layer 21 includes two increased resistance regions 22 which define a ring with two openings 22' around a region 160 of the gate layer 21. The "openings" of this ring-like structure are regions where the resistance is not increased, that is, where the specific resistance equals the specific resistance of the base material. In this example, the ring is substantially rectangular. However, this is just an example. Other types of rings, such as a circular ring, an elliptical ring, or the like, can be used as well. Furthermore, providing two openings in the ring is just an example. According to another example, there is only one increased resistance region 22 that defines a ring with only one opening, according to another example, there are more than two increased resistance regions 22 defining a ring with more than two openings. In this example, device regions located below the gate layer region 160 surrounded by the ring have a higher gate resistance than those device cells located below gate layer regions outside the ring defined by the at least one increased resistance region.

Figure 17:
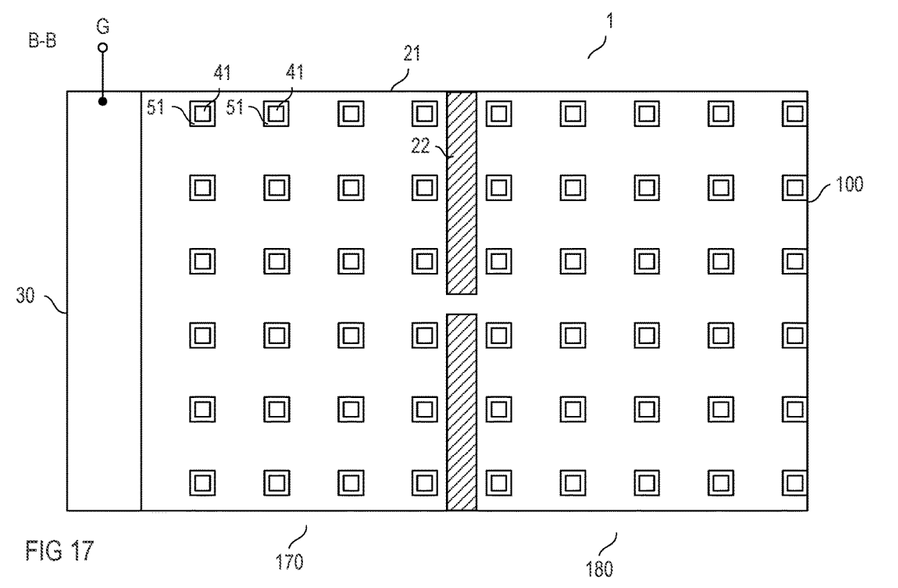

FIG. 17 shows a modification of the example shown in FIG. 13. In this example, there are two substantially longitudinal increased resistance regions 22 arranged between a first region 170 and a second region 180. The first region 170 is closer to the gate conductor 30 than the second region 180. The two longitudinal increased resistance regions 22 are spaced apart from each other, thereby defining "an opening" in the increased resistance region. According to another example, there are three or more increased resistance regions 22. In this example, device cells located below the second region 180 have a higher gate resistance than those device cells located below the first region 170.

Figure 18:
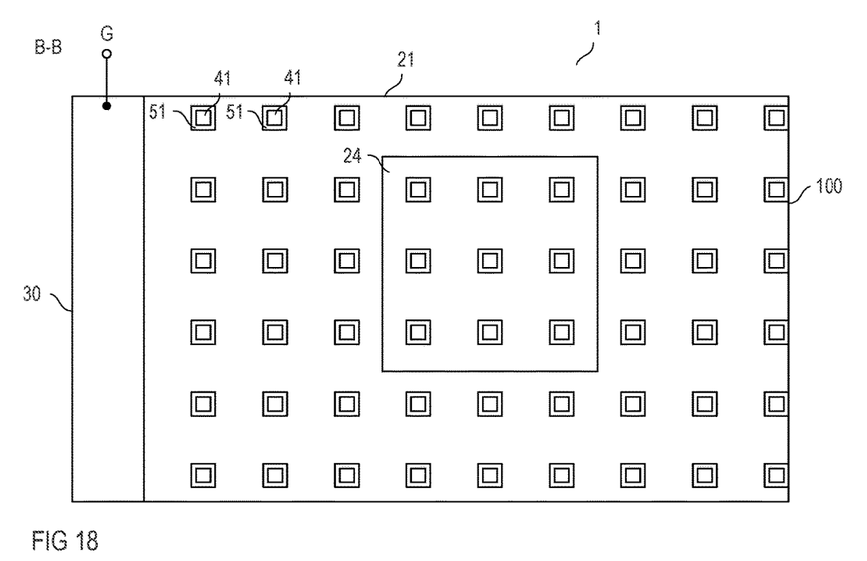

FIG. 18 shows a horizontal cross sectional view of a gate layer 21 according to another example. In this example, the gate layer 21 includes a decreased resistance region 24. This decreased resistance region 24 is located above a plurality of device cells, from which only the source vias are shown in FIG. 18. In this example, those device cells located below the decreased resistance regions 24 switch on and off substantially at the same time, while device cells located outside this region 24 switch the faster the closer they are located to the gate conductor 30, or the slower the more distant they are located to the gate conductor 30. For example, the gate layer 21 includes a doped polycrystalline semiconductor material, wherein a doping concentration in the decreased resistance region 24 is higher than in those regions outside the decreased resistance region 24.

Figure 19A:
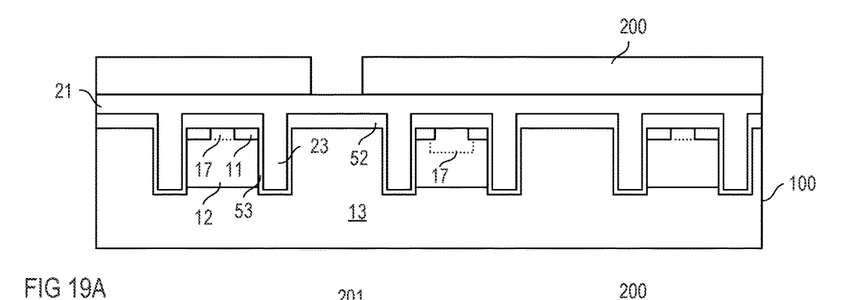
FIGS. 19A-19C show a method for producing a gate layer according to one example.
Figure 19B:
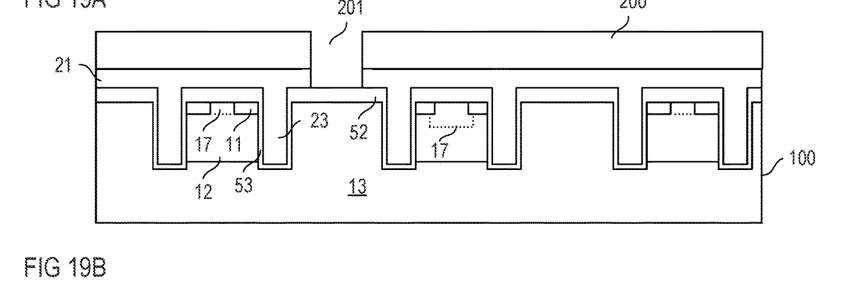
Figure 19C:
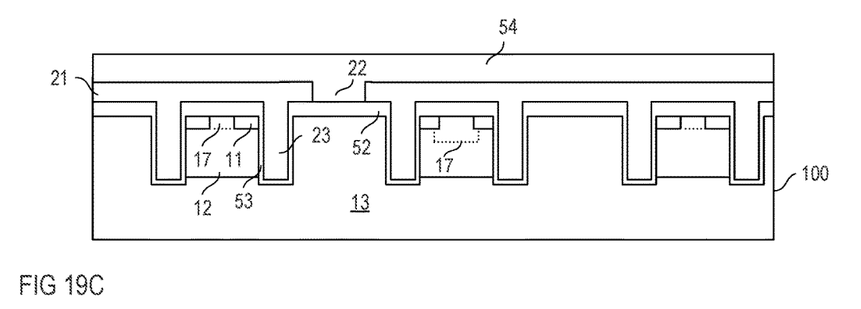

FIGS. 19A-19C show one example of a method for producing an increased resistance region 22. FIGS. 19A-19C show a vertical cross sectional view of the transistor device during (after) different process steps. In this method, the increased resistance regions 22 are formed after the gate layer 21, the source regions 11 and the body regions 12 have been produced, but before the source vias are produced.

Referring to FIG. 19A, the method includes forming an etch mask 200 on the gate layer 21. As shown in FIG. 19B, a recess 201 is formed in the gate layer 21 using the etch mask 200. The recess 201 may completely go through the gate layer 21, as shown in FIG. 19B. According to another example, a section of the gate layer 21 remains below a bottom of the recess 201 (not shown in FIG. 19B). Referring to FIG. 19C, the method further includes filling the recess 201 with a material different from the material of the gate layer 21, so as to form the increased resistance region 22. According to one example, the recess 201 is filled and the increased resistance region 22 is formed by forming the dielectric layer 54 above the gate layer 21. In this case, the material filling the recess and forming the increased resistance region 22 is the same as the material of the dielectric layer 54.

In the example shown in FIGS. 19A-19C as well as in the examples explained before the size of the increased resistance region is smaller than the size of one device cell, wherein the size of one device cell is essentially given by the size of the body region 12. This, however, is only an example. According to another example, the increased resistance region, like the decreased resistance region 24 shown in FIG. 18, covers several device cells. Referring to FIGS. 19A-19B, this can be obtained by using an etch mask with a larger opening. To obtain a device structure as shown in FIG. 5 from the structure shown in FIG. 19C the method may further include (not shown) forming the source vias 41 by etching trenches through the dielectric layer 54, the gate layer 21, and the dielectric layer 52 above the source and body regions 11, 12, forming the dielectric layer on sidewalls of these trenches at least on the gate layer 21, and forming the source electrode 40 and the source vias 41. Forming the source electrode 40 and the source vias 41 may include depositing an electrode layer that fills the trenches, so as to form the source vias 41, and covers the dielectric layer 54, so as to form the source electrode 40.

Figure 20A:
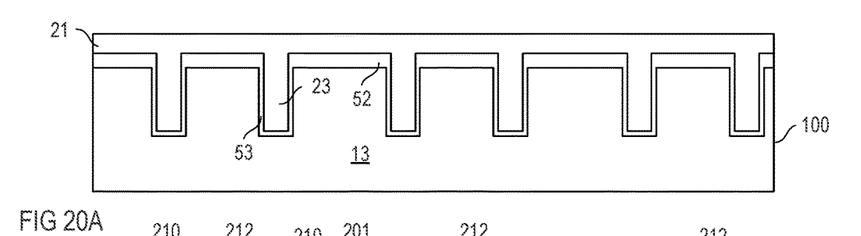
FIGS. 20A-20F show a method for producing the gate layer according to another example.

FIGS. 20A-20F show another example of a method for producing an increased resistance region 22, wherein FIGS. 20A-20F each show a vertical cross sectional view of the semiconductor body 100 during or after a process step. In this method, the gate layer 21 has been produced before the body regions 12 and the source regions 11 are produced. FIG. 20A shows the semiconductor body 100 after forming the gate structure with the gate electrodes 23, the gate dielectrics 53, the gate layer 21, and the dielectric layer 52 separating the gate layer 21 from the semiconductor body 100.

Figure 20B:
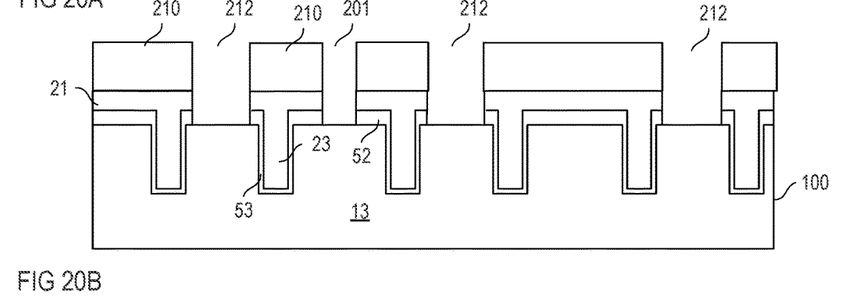

Referring to FIG. 20B, the method includes forming trenches 212 in the gate layer 21 and the dielectric layer 52 above those regions of the semiconductor body 100 where source and body regions are to be formed. Those trenches 212 are referred to as implantation trenches in the following. Furthermore, the method includes forming the recess 201 of the at least one high resistance region. Forming the implantation trenches 212 includes forming an etch mask 210 on the gate layer 21, and etching through the gate layer 21 and the dielectric layer down to the first surface 101 of the semiconductor body 100 in those regions not covered by the etch mask 210. The recess 201 of the at least one high resistance region may be formed using the same etch mask 210 and the same etching process used for forming the implantation trenches 212. In this case, the recess 201 may be as deep as the implantation trenches 212 and, therefore, may extend to the first surface 101 of the semiconductor body.

Figure 20C:
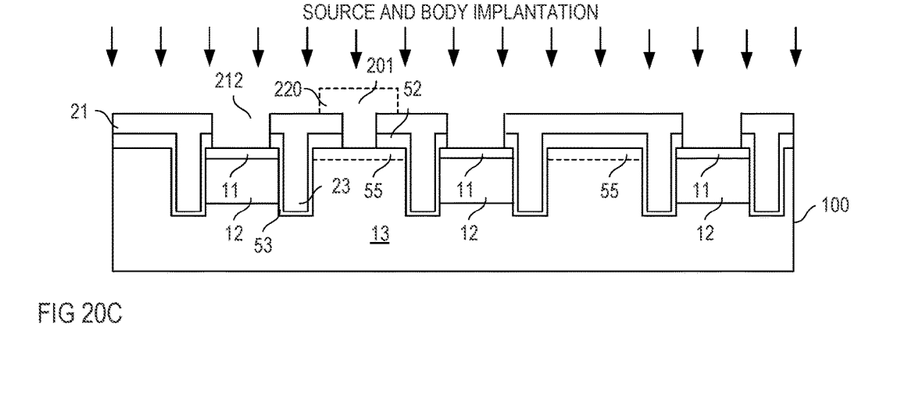

Referring to FIG. 20C, the method further includes forming the body and source regions 12, 11 by implanting dopant atoms of the first doping type and the second doping type via the implantation trenches 212 into the semiconductor body 100. According to one example, first the dopant atoms of the second doping type, which form the body regions 12, are implanted and diffused and activated in a temperature process, and then the dopant atoms of the first doping type, which form the source regions 11 are implanted and activated in a temperature process. The dopant atoms can be implanted after the etch mask 210 has been removed (as shown in FIG. 20B), or before the etch mask 210 is removed (not shown).

There are several options to prevent dopant atoms from being implanted into the semiconductor body 100 via the recess 201 in the implantation processes explained above. Two of these options are illustrated in FIG. 20C and are explained in the following.

According to one example, a protection layer 220 such as a resist layer is formed in the recess 201 before the implantation processes. Such protection layer 220 prevents dopant atoms from being implanted into the surface 101 via the recess 201.

According to another example, the dielectric layer 52 is thicker or there is another dielectric layer 55 additionally to the dielectric layer 52 in those regions of the semiconductor body 100 where no source and body regions 11, 12 are formed. This thicker dielectric layer 52 or the additional dielectric layer 55, which is located between the gate layer 21 and the drift region 13, helps to reduce the gate-drain capacitance of the transistor device. If there is such a thicker dielectric layer 52 or the additional layer 55 the implantation trenches 212 and the recess 201 can be formed such that implantation trenches 212 extend down to the surface 101 while the recess 201 stops in dielectric layer 52 or dielectric layer 55. In the implantation processes, dielectric layer 52 or dielectric layer 55 prevents dopant atoms from being implanted into the semiconductor body 100 via the recess.

According to yet another example, dopant atoms are allowed to be implanted into the semiconductor body 100 via the recess 201. Referring to the explanation below doped regions that are hereby formed below the recess will not be connected to the source electrode so that they do not affect the device characteristic.

According to yet another example (not shown), the implantation trenches 212 and the recess 201 are formed in two different etching processes using two different etch masks. In a first etching process using a first etch mask, one of the implantation trenches 212 and the recess 201 is etched. In a second etching process using a second etch mask, the other one of the implantation trenches 212 and the recess 201 is etched. In the second etching process, the second etch mask covers the implantation trenches 212 or the recess 201 formed in the first etching process. In this process sequence, a depth of the recess 201 can be adjusted independent of a depth of the implantation trenches 212. For example, the recess 201 is formed to stop on or in the dielectric layer 52 and spaced apart from the first surface 101.

Figure 20D:
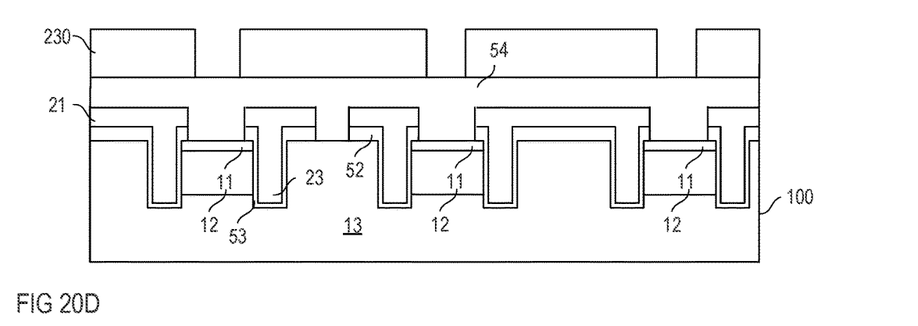
Figure 20E:
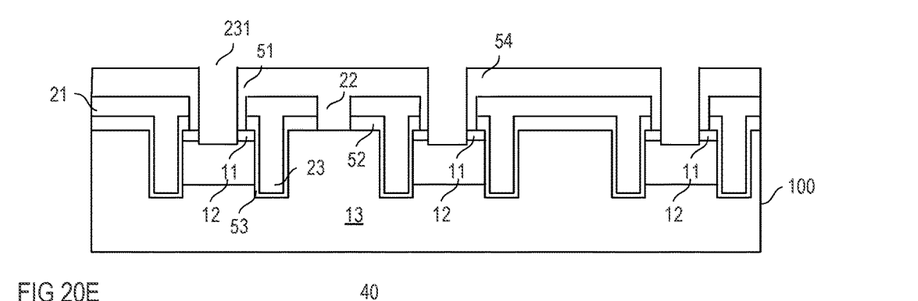
Figure 20F:
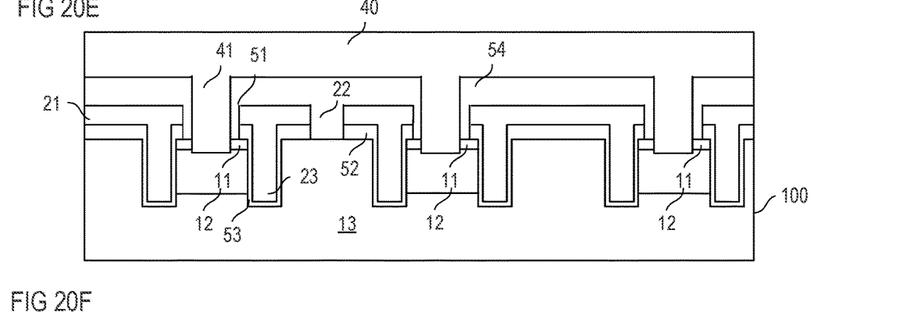

Referring to FIG. 20D, the method further includes forming a dielectric layer 54' on the gate layer 21, in the implantation trenches 212 and in the recess 201. The optional protection layer 220 explained with reference to FIG. 20C is removed before forming the dielectric layer 54'. Furthermore, another etch mask 230 is formed on the dielectric layer 54'. Using this etch mask 230 source trenches 231 are etched into the dielectric layer 54' and, optionally, into the surface 101 of the semiconductor body 100, as shown in FIG. 20E. These source trenches 231 are etched such that they are spaced apart from the gate layer 21 in a lateral direction. A section of the dielectric layer 54 remaining between the source vias 231 and the gate layer 21 forms the dielectric layer 51 that separates the gate layer 21 from the source vias 41 in the finished device. That section of the dielectric layer 54' that is formed in the recess 201 forms the high resistance region 22, and that section that remains on top of the gate layer 21 forms the dielectric layer that separates the gate layer 21 from the source electrode 40 in the finished device. Referring to FIG. 20F, the method further includes forming an electrode layer that fills the source trenches so as to form the source electrode 40 with the source vias 41.

In the method explained with reference to FIGS. 20A-20F the body regions 12 and the source regions 11 are formed after forming the gate electrodes 23 and the gate layer 21. This, however, is only an example. According to another example, the body regions 11 are formed before forming the gate electrodes 23 and the gate layer 21. In this case, only the source regions 11 are formed in the implantation process shown in FIG. 20C.

Figure 21A:
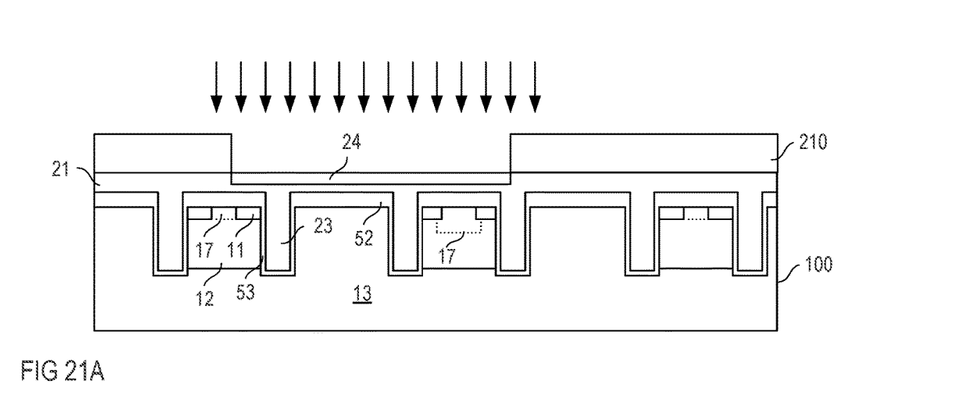
FIGS. 21A-21B show a method for producing the gate layer according to another example.
Figure 21B:
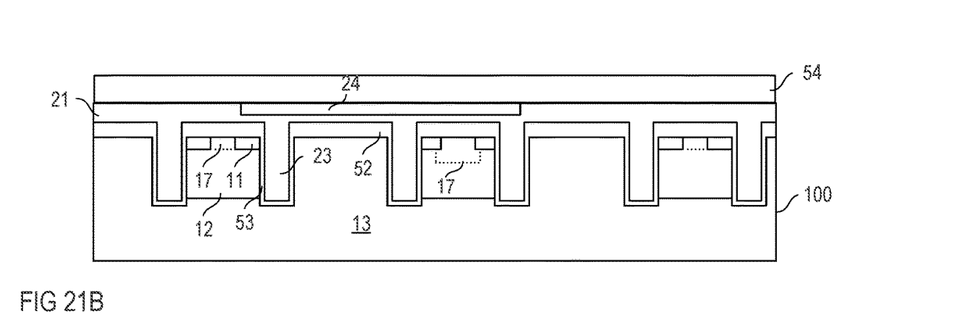

FIGS. 21A-21B show one example of a method for forming a reduced resistance region 24. Referring to FIG. 21A, this method includes forming an implantation mask 210 above the gate layer 21, and implanting dopant atoms through an opening in the implantation mask 210 into the gate layer 21 so as to form the decreased resistance region 24. According to one example, selenium and/or phosphorous ions are implanted to decrease the resistance. Referring to FIG. 21B, the dielectric layer 54 is formed above the gate layer 21 after forming the decreased resistance region 24.

If selenium is used as the dopant the resistance of the implanted regions decreases as the temperature increases. This is due to the fact that at low temperatures such as 21° C. only a fraction of the implanted selenium ions is electrically active, whereas the fraction of activated selenium ions increases as the temperature increases. It can be shown that the switching behaviour of an IGBT becomes softer as the temperature increases (for example, because the efficiency of the drain region increases at higher temperatures). The increasing softness at higher temperatures increases the switching losses. The decrease of the gate resistances of at least some device cells at higher temperatures causes these device cells to switch faster as the temperature increases. This, in turn, at least partially counteracts the increase in the switching losses.

According to another example, additionally or optionally to forming the low-resistance region 24 selenium atoms are implanted into the gate layer 21 via the complete surface, that is, without an implantation mask.

Figure 22A:
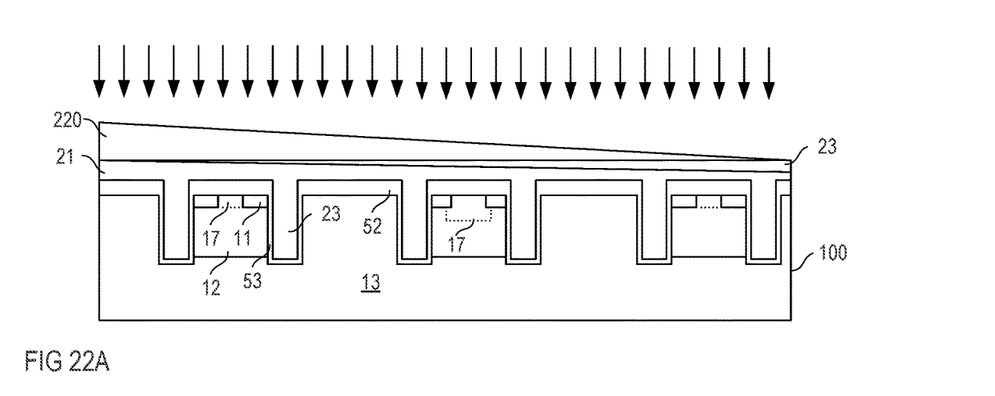
FIGS. 22A-22B show a method for producing the gate layer according to yet another example.
Figure 22B:
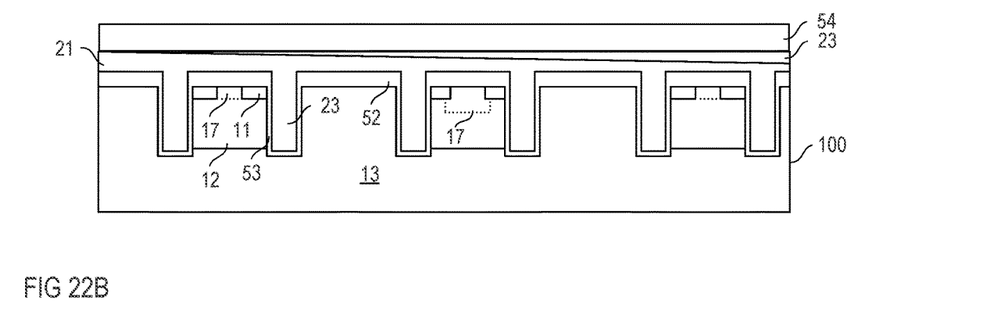
Figure 23:
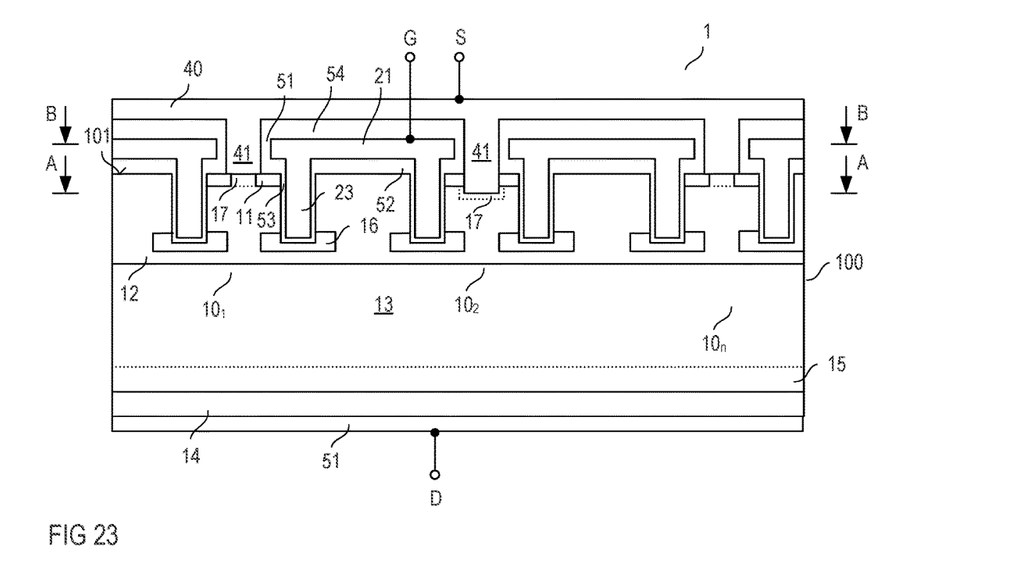
FIG. 23 shows a vertical cross sectional view of an insulated gate semiconductor device implemented as an emitter-switched thyristor.

FIGS. 22A-22B show another example of a method for producing a decreased resistance region 24. In this example, referring to FIG. 21A, the decreased resistance region 24 is formed with a varying dopant dose by having an implantation mask 220 with a varying thickness. Through those regions of the implantation mask 220 that have a higher thickness, less dopant atoms are implanted into the gate layer 21 than through those regions having a lower thickness. Referring to FIG. 22B, the dielectric layer 54 is formed on the gate layer 21 after removing the implantation mask 220. Alternatively, a number of different implantations using different implantation masks may be used to vary the doping and, therefore, the resistance in the lateral direction. It is also possible and a very flexible method to use only one implantation where a mask is used that has a plurality of openings such that at different locations different percentages of area of the gate layer 21 are uncovered by the implantation mask.

Each of the methods explained with reference to FIGS. 19A-19B, 21A-21B, and 22A-22B can be followed by process steps for forming the source electrode 40 with the source vias 41. These process steps may include forming trenches that reach to the first surface 101 of the semiconductor body 100 or into the semiconductor body 100 to the body region 12, forming the dielectric layer 51 (see FIGS. 5 and 9) on the gate layer 21 at sidewalls of these trenches, filling the trenches with an electrically conducting material, and forming the source electrode 40 on the dielectric layer 54. One process sequence may be used to achieve both fill the trenches to form the source vias 41 and form the source electrode 40.

A gate layer with increased or decreased resistance regions is not restricted to be implemented in an IGBT or MOSFET, as explained above, but may be implemented in any other type of semiconductor device with an insulated gate electrode and a plurality of device cells as well. One example of such other semiconductor device is an emitter switched thyristor. FIG. 22 shows a vertical cross sectional view of an emitter-switched thyristor. The structure of an emitter-switched thyristor is similar to that of an IGBT. Thus, in the following, the differences between the emitter switched thyristor and an IGBT are explained.

The emitter switched thyristor shown in FIG. 22 is different from an IGBT, such as the IGBT shown in FIG. 5, in that in each device cell a first base region 12, which forms the body region in the IGBT, includes a first emitter region 11, which forms the source region in the IGBT, and a further emitter region 16 spaced apart from the first emitter region 11 and adjoining the gate dielectric 53. The further emitter region has the same doping type as the first emitter region 11. The first base region is arranged such that a section of the first base region 12 separates the further emitter region 16 from a second base region 15, which forms the drift region in the IGBT. In the on-state of the emitter switched thyristor, the gate electrode 23 generates a conducting channel in the first base region 12 along the gate dielectric between the first emitter region 11 and the further emitter region 16, wherein the further emitter region 16 injects charge carriers (for example, electrons if the further emitter region 16 is n-doped) through the first base region 12 into the second base region 15. Furthermore, a second emitter region 14, which forms the drain region in the IGBT, injects charge carriers of a complementary type (for example, holes if the second emitter region 14 is p-doped).

What is claimed is:

1. A semiconductor device, comprising:
   a plurality of device cells, each comprising a body region, a source region, and a gate electrode adjacent to the body region and dielectrically insulated from the body region by a gate dielectric; and
   an electrically conductive gate layer electrically connected to the gate electrodes of the plurality of device cells,
   wherein the gate layer is electrically connected to a gate conductor and comprises a plurality of increased resistance regions,
   wherein the gate layer includes a first region, a second region, and a third region that are arranged at increased distances from the gate conductor, respectively, and
   a concentration of the plurality of increased resistance regions in the gate layer increases as a distance to the gate conductor increases such that a concentration of the plurality of increased resistance regions in the second region is greater than a concentration of the plurality of increased resistance regions in the first region, and a concentration of the plurality of increased resistance regions in the third region is greater than the concentration of the plurality of increased resistance regions in the second region.

2. The semiconductor device of claim 1, wherein each increased resistance region of the plurality of increased resistance regions comprises a recess in the gate layer.

3. The semiconductor device of claim 2, wherein the recess is filled with a recess material different from a material of the gate layer.

4. The semiconductor device of claim 3, wherein the recess material is an electrically insulating material.

5. The semiconductor device of claim 2, wherein the recess extends completely through the gate layer.

6. The semiconductor device of claim 1, wherein the gate layer comprises a polycrystalline semiconductor material with a basic doping concentration and a decreased resistance region having a doping concentration higher than the basic doping concentration.

7. The semiconductor device of claim 6, wherein the decreased resistance region comprises one of phosphorous and selenium atoms.

8. The semiconductor device of claim 1, wherein each of the plurality of device cells comprises a source via electrically connected to the source region and dielectrically insulated from the gate layer.

9. The semiconductor device of claim 1, wherein the electrically conductive gate layer comprises the gate electrodes of the plurality of device cells.

10. The semiconductor device of claim 1, wherein a switching delay of each device cell of the plurality of device cells that is adjacent to an increased resistance region of the plurality of increased resistance regions is increased based on the increased resistance region.

11. The semiconductor device of claim 1, wherein the gate conductor forms a gate node or is connected directly to the gate node of the semiconductor device.

12. The semiconductor device of claim 1, wherein the first region of the gate layer is adjacent to the gate conductor.

13. The semiconductor device of claim 1, wherein the plurality of increased resistance regions are each configured to increase a gate resistance of each device cell of the plurality of device cells that is adjacent to a respective increased resistance region.

14. A semiconductor device, comprising:
   a plurality of device cells, each comprising a body region, a source region, and a gate electrode adjacent to the body region and dielectrically insulated from the body region by a gate dielectric; and
   an electrically conductive gate layer electrically connected to the gate electrodes of the plurality of device cells,
   wherein the gate layer is electrically connected to a gate conductor and comprises a plurality of increased resistance regions,
   wherein the gate layer includes a first region and a second region, the first region being arranged adjacent to the gate conductor, and the second region extending from the first region in a lateral direction away from the gate conductor, and
   a concentration of the plurality of increased resistance regions in the second region of the gate layer increases as a distance to the gate conductor increases.

* * * * *